(12) United States Patent
Ferstl et al.

(10) Patent No.: US 7,276,781 B2
(45) Date of Patent: Oct. 2, 2007

(54) MULTICHIP MODULE FOR LOC MOUNTING AND METHOD FOR PRODUCING THE MULTICHIP MODULE

(75) Inventors: Klemens Ferstl, Regensburg (DE); Andreas Woerz, Kelheim (DE); Ulrich Vidal, Landshut (DE)

(73) Assignee: Infineon Technologies AG, Munich (DE)

( * ) Notice: Subject to any disclaimer, the term of this patent is extended or adjusted under 35 U.S.C. 154(b) by 1017 days.

(21) Appl. No.: 10/022,605

(22) Filed: Dec. 17, 2001

(65) Prior Publication Data

US 2002/0079559 A1 Jun. 27, 2002

Related U.S. Application Data

(63) Continuation of application No. PCT/DE00/01767, filed on May 30, 2000.

(30) Foreign Application Priority Data

Jun. 17, 1999 (DE) ................................ 199 27 747

(51) Int. Cl.
*H01L 23/495* (2006.01)
(52) U.S. Cl. ...................................... 257/666; 257/676

(58) Field of Classification Search ........ 257/666–677, 257/692; 435/123, 124
See application file for complete search history.

(56) References Cited

U.S. PATENT DOCUMENTS

| 5,208,782 A | 5/1993 | Sakuta et al. |
| 5,331,201 A | 7/1994 | Nishino |
| 5,559,305 A | 9/1996 | Lee et al. |
| 5,583,375 A * | 12/1996 | Tsubosaki et al. .......... 257/692 |
| 6,246,615 B1 * | 6/2001 | King et al. ................. 365/200 |

FOREIGN PATENT DOCUMENTS

| DE | 43 01 915 A1 | 5/1994 |
| DE | 197 04 385 A1 | 8/1997 |
| DE | 197 12 551 A1 | 11/1997 |

* cited by examiner

*Primary Examiner*—Cuong Nguyen
(74) *Attorney, Agent, or Firm*—Laurence A. Greenberg; Werner H. Stemer; Ralph E. Locher

(57) ABSTRACT

A multichip module for leads-on-chip mounting is described. The multichip module has a lead-frame, a common, contiguous part of a wafer slice disposed in the lead-frame, and a number of semiconductor chips disposed next to one another in the lead-frame. At least some of the semiconductor chips disposed in the lead-frame are disposed on the common, contiguous part of the wafer slice.

13 Claims, 2 Drawing Sheets

MULTICHIP MODULE FOR LOC MOUNTING AND METHOD FOR PRODUCING THE MULTICHIP MODULE

CROSS-REFERENCE TO RELATED APPLICATION

This application is a continuation of copending International Application No. PCT/DE00/01767, filed May 30, 2000, which designated the United States.

BACKGROUND OF THE INVENTION

Field of the Invention

The invention relates to a multichip module for leads-on-chip (LOC) mounting. The multichip module has a number of semiconductor chips disposed next to one another in a lead-frame.

In leads-on-chip (LOC) mounting of semiconductor chips, the individual semiconductor chip is connected by a fastening device (for example in the form of a polyimide carrier tape ("tape") coated on both sides with a thermoplastic adhesive) to a substrate carrier in the form of a "lead-frame", with a number of "leads" protruding with their free ends into the lead-frame. With this type of mounting, the semiconductor chip lies in the lead-frame beneath the free ends of the leads and is adhesively attached to the free ends of the leads by the polyimide carrier tape that lies in between and is adhesive on both sides. The individual leads are subsequently electrically connected ("bonded") by bond wire connections ("bonds") to corresponding metallic bonding pads ("pads") on the upper side of the semiconductor chip, for example by thin gold wires. After it has been produced (and before the LOC mounting), the semiconductor chip itself is usually initially disposed together with many other semiconductor chips on a wafer slice and, before it is used in an electrical or electronic circuit, i.e. before the LOC mounting, is sawn out from the wafer slice.

When a number of such individually separated semiconductor chips are mounted in a common lead-frame, production tolerances may coincide during the mounting to produce an undesired offset of individual chips, which results in corresponding inaccuracies and defects, in particular during the subsequent production of the bonds. In particular in the case of large chip areas, this may lead to commercially no longer acceptable failures in the mounting process if corresponding package tolerances are exceeded. When producing the bonds for n chips in a lead-frame, n successive connecting steps ("diebonding steps") are generally also required, which leads to correspondingly long production times. Furthermore, in such cases, problems with the attachment of the individual chips in the lead-frame may also occur, since, depending on the configuration of the free ends of the leads in the lead-frame, the chips are generally only connected on one side and during this time are consequently mechanically loaded on one side.

Published, Non-Prosecuted German Patent Application DE 197 12 551 A1 discloses a lead-frame and a production process for semiconductor components, the lead-frame being configured in such a way that it can be attached to a wafer, in which a multiplicity of identical components are integrated. For the production of the components, the lead-frame is placed onto the wafer and connected there to the individual semiconductor components by wire bridges. This is followed by an encapsulating process, by which a region that encloses the metallic wires and leads of the lead-frame is formed.

SUMMARY OF THE INVENTION

It is accordingly an object of the invention to provide a multichip module for LOC mounting and a method for producing the multichip module which overcome the above-mentioned disadvantages of the prior art devices and methods of this general type, with which the number of failures during mounting is as low as possible. Furthermore, it should also be possible to reduce the mounting time in comparison with conventional mounting methods, and on the other hand to provide a method for producing such a multichip module suitable for LOC mounting which can be realized as simply as possible and at low cost.

With the foregoing and other objects in view there is provided, in accordance with the invention, a multichip module for leads-on-chip mounting. The multichip module has a lead-frame, a common, contiguous part of a wafer slice disposed in the lead-frame, and a number of semiconductor chips disposed next to one another in the lead-frame. At least some of the semiconductor chips disposed in the lead-frame are disposed on the common, contiguous part of the wafer slice.

The essence of the invention is to divide up (for example saw up) the wafer slice in such a way that the semiconductor chips intended for mounting in the lead-frame (or at least some of the chips) remain on a common, contiguous part of the wafer slice, which is then introduced as a whole into the lead-frame during the LOC mounting. Subsequently, the leads are fastened (for example adhesively attached) by their free ends, as usual, at the intended locations on the upper side of the chips and, thereafter, electrically connected to the bonding pads on the upper side of the chips (for example by bond wire connections).

A major advantage of the solution according to the invention can be seen primarily in that there is no sawing-induced offset and/or mounting-induced offset between the individual semiconductor chips, which would have adverse effects during bonding in particular. In general, this allows mounting tolerances (for example during insertion of the part of the wafer slice with the chips into the lead-frame) to be reduced considerably, if not even to the extent that they become negligible.

A further advantage can be seen in that only one bonding operation per lead-frame is required, so that the mounting times can also be reduced considerably.

As a result of the predetermined unalterable configuration of the chips with respect to one another on the common, contiguous part of the wafer slice, finally the fastening (for example adhesive bonding) of the free ends of the leads on the upper side of the chips can be carried out correspondingly simply, quickly and accurately (i.e. with correspondingly reduced tolerances).

In an advantageous embodiment of the multichip module according to the invention, it is provided that the lateral contour of the common, contiguous part of the wafer slice with chips located on it is adapted to the lateral contour of the lead-frame, for example in such a way that the two contours are the same or at least approximately the same distance from one another all the way around.

The advantage of the solution is that the contour adaptation allows the mounting tolerances to be reduced still further and incorrect placements of the chips in the lead-frame to be prevented.

In view of the currently customary rectangular or square form/contour of the chips, it has proven to be expedient for the lead-frame also to have a rectangular or square lateral contour.

This is of advantage in particular whenever the number of chips to be disposed in the lead-frame is 2 or a multiple of 2 such as 4, 6, 8 . . . , since then the chips can generally be disposed on the wafer slice in such a way that the common part of the slice, which is intended to be introduced into the lead-frame, likewise has a rectangular or square contour.

In accordance with an added feature of the invention, the semiconductor chips each have an upper side and bonding pads disposed on the upper side. The lead-frame has a number of leads protruding laterally into the lead-frame and the leads have free ends. A fastening device is provided for fastening the free ends of the leads protruding into the lead-frame, the fastening device is disposed on the upper side of individual ones of the semiconductor chips. Bonding connections are provided for electrically connecting the leads to corresponding ones of the bonding pads.

In accordance with an additional feature of the invention, the fastening device is formed of carrier tapes disposed between the upper side of the semiconductor chips and an underside of the free ends of the leads.

In accordance with another feature of the invention, the free ends of the leads have selected parts fastened to the upper side of at least two of the semiconductor chips and are electrically connected to the bonding pads of the at least two semiconductor chips.

In accordance with a further feature of the invention, the selected parts of the free ends of the leads have branches being either dovetail-shaped branches or T-shaped branches. The branches are respectively fastened to the at least two of the semiconductor chips.

In accordance with another further feature of the invention, the free ends of the leads are mirror symmetric or rotational symmetric in their placement in the lead-frame.

In accordance with another additional feature of the invention, the carrier tapes are formed from polyimide and are coated on both sides with a thermoplastic adhesive.

With the foregoing and other objects in view there is provided, in accordance with the invention, a method for producing a multichip module for leads-on-chip mounting. The method includes the steps of mounting a number of semiconductor chips on a wafer slice next to one another; removing a part of the wafer slice having the semiconductor chips from the wafer slice resulting in a common, contiguous part; and inserting the common, contiguous part in a lead-frame.

Other features which are considered as characteristic for the invention are set forth in the appended claims.

Although the invention is illustrated and described herein as embodied in a multichip module for LOC mounting and a method for producing the multichip module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
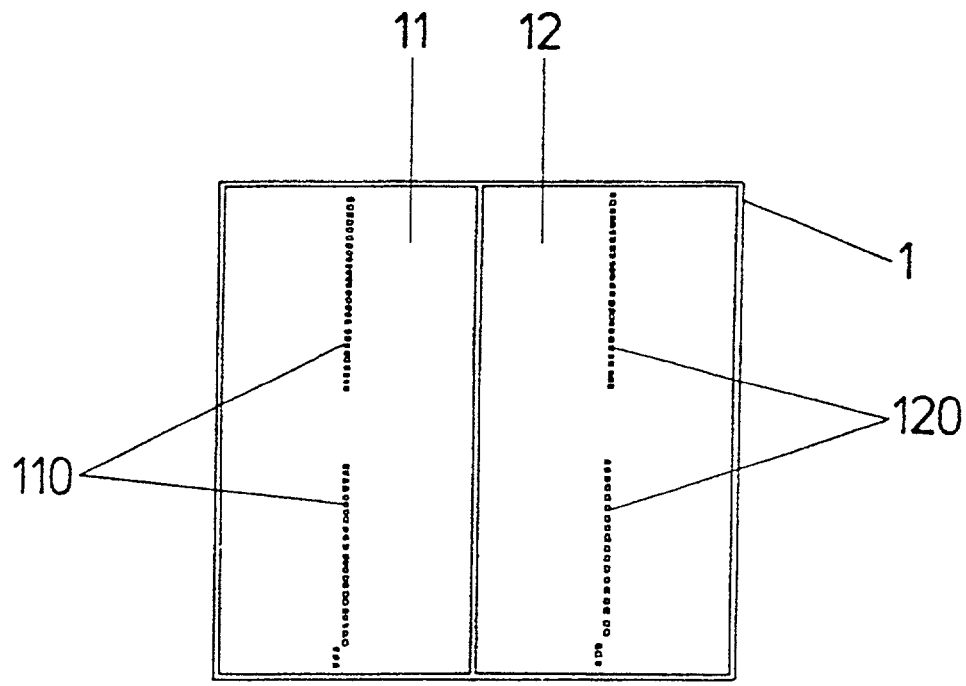
FIG. 1 is a diagrammatic, plan view of a part of a preferred embodiment of the multichip module with a pair of semiconductor chips on a common part of a wafer slice according to the invention.

Referring now to the figures of the drawing in detail and first, particularly, to FIG. 1 thereof, there is shown a part 1 of a wafer slice with two rectangular semiconductor chips 11 and 12 disposed next to each other, on an upper side of which a row of metallic bonding pads 110 and 120 are disposed. The common (for both of the chips 11 and 12), contiguous part 1 of the wafer slice can be removed from the wafer slice, for example by sawing out.

Figure 2:
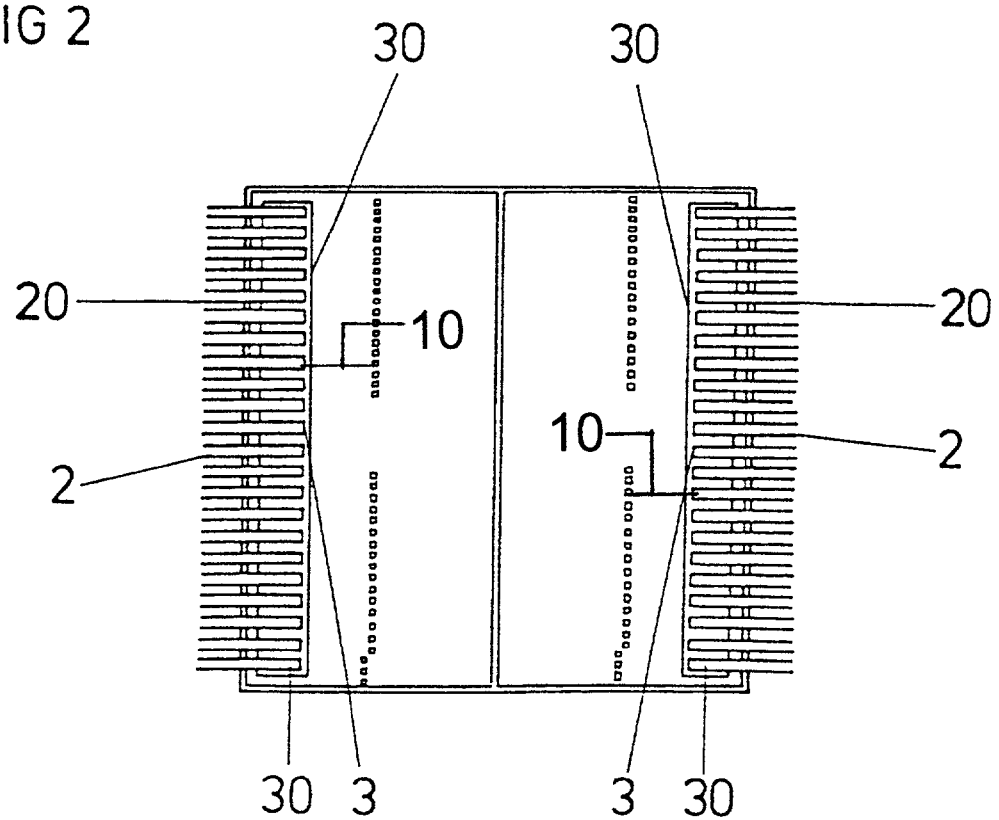
FIG. 2 is a plan view of a first advantageous configuration of the multichip module according to the invention with the pair of semiconductor chips according to FIG. 1.

In the embodiment of the multichip module in FIG. 2, the common, contiguous part 1 of the wafer slice with the two chips 11 and 12 is disposed in a lead-frame. Leads 2 of the lead-frame are led out from two opposite sides, protrude with their free ends 20 over the chips 11 and 12 into the lead-frame and are in each case adhesively attached by a strip 30 of a polyimide carrier tape 3, coated on both sides with thermoplastic adhesive, onto the upper side of the corresponding chip 11 or 12, respectively. In a subsequent mounting step, the free ends 20 of the leads 2 are then electrically connected by bonding, for example by thin bond wires of gold 10, to the bonding pads 110 or 120 on the upper side of the respective semiconductor chip 11 or 12.

Figure 3:
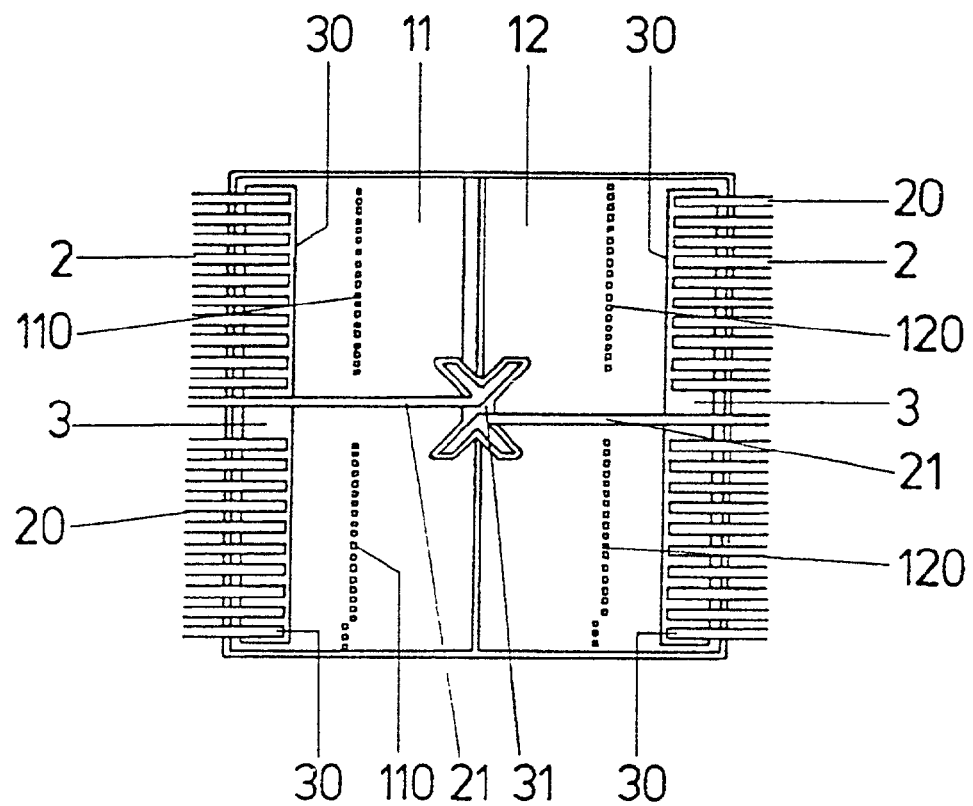
FIG. 3 is a plan view showing a second advantageous configuration of the multichip module according to the invention with the pair of semiconductor chips according to FIG. 1.

The embodiment of the multichip module shown in FIG. 3 differs from the embodiment of the module shown in FIG. 2 only in that two of the leads 2 are extended with their free ends 21 and securely attached by correspondingly long adhesive strips 31 on the two chips 11 and 12, the ends 21 and the adhesive strips 31 located thereunder being splayed in a dovetail form. The remaining parts of the module shown in FIG. 2 coincide with the corresponding parts of the module shown in FIG. 1 and therefore also bear the same reference numerals as in FIG. 1. With respect to the parts that are common to both FIGS. 1 and 2, reference is therefore made to the description relating to FIG. 1.

The major advantage of the embodiment of the module in shown FIG. 3 can be seen in that an additional stabilization of the part 1 of the wafer slice is achieved with respect to the lead-frame.

Figure 4:
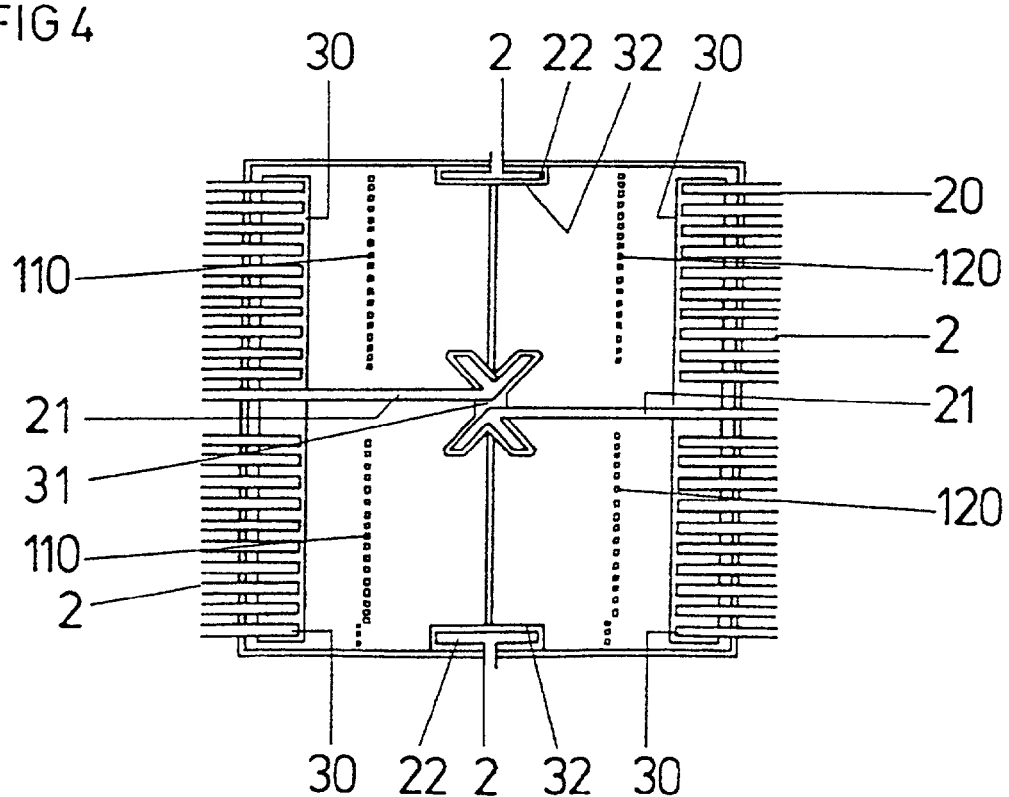
FIG. 4 is a plan view of a third advantageous configuration of the multichip module according to the invention with the pair of semiconductor chips according to FIG. 1.

Finally, the embodiment of the multichip module shown in FIG. 4 differs from the embodiment of the module shown in FIG. 3 only in that from each of the two previously free sides of the lead-frame there is additionally led out a further lead 2, the free end 22 of which is of a T-shaped form and is securely attached correspondingly by a T-shaped adhesive strip 32 on the upper side of both chips 11 and 12. The remaining parts of the module shown in FIG. 4 coincide with the corresponding parts of the module shown in FIG. 3 and therefore also bear the same reference numerals as in FIGS.

1 and 2. With respect to the parts that are common to all the figures reference is therefore made to the description relating to FIGS. 1 and 2.

The major advantage of the embodiment of the module in FIG. 4 can be seen in that a further stabilization of the part of the wafer slice is achieved.

The invention is not restricted to the exemplary embodiments represented, but rather can be transferred to other embodiments.

For example, instead of the rectangular or square lateral contours of the common, contiguous part 1 of the wafer slice with the chips 11 or 12 located on it and/or of the lead-frame, it is possible to choose a different contour, which is formed for example as a polygon, which has for example only right angles. This may be of advantage in particular whenever the number of chips to be mounted per lead-frame is not a multiple of 2 or is an uneven number and/or the chips are of different sizes. In the case of three chips, for example, an L-shaped lateral contour would be conceivable. Of course, these three chips may also be disposed next to one another on a rectangular or else, if appropriate, a square common, contiguous part of the wafer slice.

It is also conceivable to fasten (for example securely adhere) further leads by their free ends to both chips or, if appropriate, to more than two chips.

We claim:

1. A multichip module for leads-on-chip mounting, comprising:
    a lead-frame having a number of leads protruding laterally into said lead-frame and said leads having free ends;
    a common, contiguous part of a wafer slice disposed in said lead-frame;
    a number of semiconductor chips disposed next to one another in said lead-frame, at least some of said semiconductor chips disposed in said lead-frame disposed on said common, contiguous part of said wafer slice, said semiconductor chips each having an upper side and bonding pads disposed on said upper side;
    a fastening device for fastening said free ends of said leads protruding into said lead-frame, said fastening device disposed on said upper side of individual ones of said semiconductor chips; and
    bonding connections electrically connecting said leads to corresponding ones of said bonding pads;
    said free ends of said leads having selected parts fastened to said upper side of at least two of said semiconductor chips and electrically connected to said bonding pads of said at least two of said semiconductor chips.

2. The multichip module according claim 1, wherein said lead-frame has a lateral contour, and said common, contiguous part of said wafer slice has a lateral contour adapted to said lateral contour of said lead-frame.

3. The multichip module according to claim 2, wherein said lateral contour of said common, contiguous part of said wafer slice with said semiconductor chips and said lateral contour of said lead-frame are at a substantially constant distance from one another all away around.

4. The multichip module according to claim 2, wherein said lateral contour of at least one of said lead-frame and of said common, contiguous part of said wafer slice has a shape selected from the group consisting of rectangular shapes and square shapes.

5. The multichip module according to claim 1, wherein said number of said semiconductor chips disposed on said common, contiguous part of said wafer slice is 2n, where n is equal to a natural number greater than or equal to 1.

6. The multichip module according to claim 1, wherein said fastening device is formed of carrier tapes disposed between said upper side of said semiconductor chips and an underside of said free ends of said leads.

7. The multichip module according to claim 1, wherein said selected parts of said free ends of said leads have branches selected from the group consisting of dovetail-shaped branches and T-shaped branches, and said branches are respectively fastened to said at least two of said semiconductor chips.

8. The multichip module according to claim 1, wherein said free ends of said leads are one of mirror symmetric and rotational symmetric in their placement in said lead-frame.

9. The multichip module according to claim 5, wherein said number n is equal to 1.

10. The multichip module according to claim 5, wherein n is equal to 2.

11. The multichip module according to claim 5, wherein n is equal to 3.

12. The multichip module according to claim 5, wherein n is equal to 4.

13. The multichip module according to claim 6, wherein said carrier tapes are formed from polyimide and are coated on both sides with a thermoplastic adhesive.

* * * * *